United States Patent
Francis

(10) Patent No.: US 8,264,308 B2
(45) Date of Patent: Sep. 11, 2012

(54) DETECTION OF THE ONSET OF SWITCH ACTUATION VIA MAGNETIC FIELD

(75) Inventor: Roderick M. Francis, Clayton, NC (US)

(73) Assignee: Shallco, Inc., Smithfield, NC (US)

( * ) Notice: Subject to any disclaimer, the term of this patent is extended or adjusted under 35 U.S.C. 154(b) by 832 days.

(21) Appl. No.: 12/203,997

(22) Filed: Sep. 4, 2008

(65) Prior Publication Data

US 2010/0052661 A1   Mar. 4, 2010

(51) Int. Cl.
*H01H 13/04* (2006.01)
(52) U.S. Cl. .................................. 335/205; 335/206
(58) Field of Classification Search .......... 335/205–207, 335/302–306
See application file for complete search history.

(56) References Cited

U.S. PATENT DOCUMENTS

| | | | |
|---|---|---|---|
| 4,199,741 A * | 4/1980 | Serrus Paulet | 335/206 |
| 4,395,695 A * | 7/1983 | Nakamura | 338/32 H |
| 4,425,557 A * | 1/1984 | Nakamura | 338/32 H |
| 4,868,530 A * | 9/1989 | Ahs | 335/207 |
| 5,890,384 A * | 4/1999 | Bartel et al. | 70/264 |
| 6,223,571 B1 * | 5/2001 | Rector | 70/276 |
| 6,690,253 B1 * | 2/2004 | Precure | 335/205 |
| 7,113,063 B2 * | 9/2006 | Romanik et al. | 335/205 |
| 2003/0094945 A1 * | 5/2003 | Netzer | 324/260 |

OTHER PUBLICATIONS

"AS5045 12 Bit Programmable Magnetic Rotary Encoder." Fact Sheet, pp. 1-16. www.austriamicrosystems.com. Austria Microsystems AG, Unterpremstaetten, Austria.

"AS5045 12 Bit Programmable Magnetic Rotary Encoder." Fact Sheet, pp. 1-16. www.austriamicrosystems.com. Austria Microsystems AG, Unterpremstaetten, Austria, Jan. 16, 2006.

* cited by examiner

*Primary Examiner* — Bernard Rojas
(74) *Attorney, Agent, or Firm* — Coats & Bennett, P.L.L.C.

(57) ABSTRACT

A magnet is affixed to a shaft or other pivoting or rotating member of a switch mechanism, on the axis of rotation. The radial position of the resulting magnetic field is monitored. A change in the magnetic field radial position, optionally in excess of a threshold, indicates the onset of switch actuation, prior to operative actuation of the switch mechanism. The radial position of the magnetic field is sensed by a magnetic rotary encoder. The detection of switch actuation onset may be used to remove current from a circuit prior to operative switch actuation. Because the magnet is rigidly affixed to the shaft, there is no lost motion. Because the shaft position and encoder are magnetically coupled, the detection mechanism contains no moving parts and no mechanical linkage or coupling, and its performance does not degrade due to shock, thermal effects, vibration, or wear.

17 Claims, 3 Drawing Sheets

DETECTION OF THE ONSET OF SWITCH ACTUATION VIA MAGNETIC FIELD

FIELD OF THE INVENTION

The present invention relates generally to industrial switches, and in particular to a system and method for detecting the onset of switch actuation via a change in the position of a magnetic field.

BACKGROUND

Multi-function industrial equipment is known in the art. Many manufacturers produce equipment containing configurable circuits, such as high-voltage and/or high-current windings, that can be selectively configured to provide different functionality. For example, a device including a gas or diesel engine may be selectively configured to operate as a 1000 A welder or as an AC or DC generator. The switches that configure the circuits to perform the selected function are capable of carrying high current, but are not capable of circuit interruption under load. Such interruption may cause arcing, destroying the switch contacts and possibly presenting a fire or shock hazard.

The equipment operator is responsible for understanding the equipment, and knowing what configuration changes can be selected under load. The operator is responsible for reducing or removing the load before changing the equipment configuration, where the configuration change may present a hazard. This reliance on the discretion of skilled and knowledgeable operators routinely results in equipment damage.

In order to remove current from field coils prior to actuation of a switch that would cause current interruption at the switch contacts, equipment manufacturers attempt to detect the onset of switch actuation, and use fast switching circuits such as transistors to change the equipment circuit configuration. A typical rotary switch employing mechanical detents for positive actuation may change state in 20-50 msec. A protection circuit can divert current from a field winding in 10-15 msec, if the onset of switch actuation can be accurately determined.

Prior art switch mechanisms for multi-function industrial equipment utilize mechanical sensors and a precisely positioned cam surface to attempt to detect the onset of actuation of the switch. However, the cam and sensors require precise positioning and careful adjustment to achieve proper detection, increasing the cost of the switch mechanism. Additionally, shock and vibration due to the industrial environment, as well as wear, degrade the reliability of the mechanical sensors.

One known approach to detecting the onset of switch actuation is to incorporate a strain gauge into the switch mechanism, to detect and quantify the force applied to the switch handle. If the force exceeds a threshold, preventive measures such as reconfiguring circuit components can be initiated. However, a strain gauge is a transducer, and it has a mechanical component that must be precisely aligned and configured in the switch mechanism, and is subject to vibration and wear. Additionally, the strain gauge must be properly calibrated. A strain gauge approach is thus deficient for reliable switch actuation onset detection and warning, for the same reasons as mechanical sensors.

SUMMARY

According to one or more embodiments described herein, a magnet is affixed to a shaft or other pivoting or rotating member of a switch mechanism, on the axis of rotation. The radial position of the resulting magnetic field is monitored. A change in the magnetic field radial position, optionally in excess of a threshold, indicates the onset of switch actuation, prior to operative actuation of the switch mechanism. The radial position of the magnetic field is sensed by a magnetic rotary encoder.

DETAILED DESCRIPTION

Switch mechanisms, such a rotary contact switches commonly deployed on multi-function industrial equipment, include "lost" motion resulting from fits and tolerances in the mechanical couplings between the switch contacts and the handle. The lost motion is physical motion of the switch handle that does not translate to movement of the switch contacts. That is, when a switch is actuated by applying torque to the handle, there is some "play," or rotary motion of the axis, prior to any switch contact detent being dislodged from its position during the operative switch actuation. Prior art switch actuation onset detection mechanisms either attempt to detect the lost motion mechanically, or detect force applied to the switch handle after the lost motion has occurred, as described above.

According to one or more embodiments of the present invention, the lost motion is detected by sensing the rotation (i.e., change in radial position) of a magnetic field of a magnet affixed to the switch axis. An indication of the onset of switch actuation is generated in response to sensing a change in the radial position of the magnetic field, with respect to the axis. This indication provides an early warning that may be used to change a configuration of circuits in the equipment (e.g., remove current from one or more windings), so as to make the operative switch actuation a benign event. Because the magnet is rigidly affixed to the switch axis (e.g., glued), there is no lost motion between the magnet and any part of the switch mechanism. That is, any and all change in radial position of the magnetic field is due to movement of the switch handle, and may be assumed to be the onset of switch actuation by turning the handle.

Contactless magnetic rotary encoders are known in the art. As a non-limiting example, one such magnetic encoder is the AS5045 12-bit programmable magnetic rotary encoder available from Austria Micro Systems of Unterpremstätten, Austria (austriamicrosystems.com). The encoder provides an angular measurement of a two-pole magnet positioned proximate the device housing, as a 12-bit serial digital bit stream and a Pulse Width Modulated (PWM) signal. The 12-bit digital representation achieves a resolution of 360°/4098=0.0875°, and the PWM pulse is programmable for 1 µ-sec/step or 2 µ-sec/step.

Figure 1:
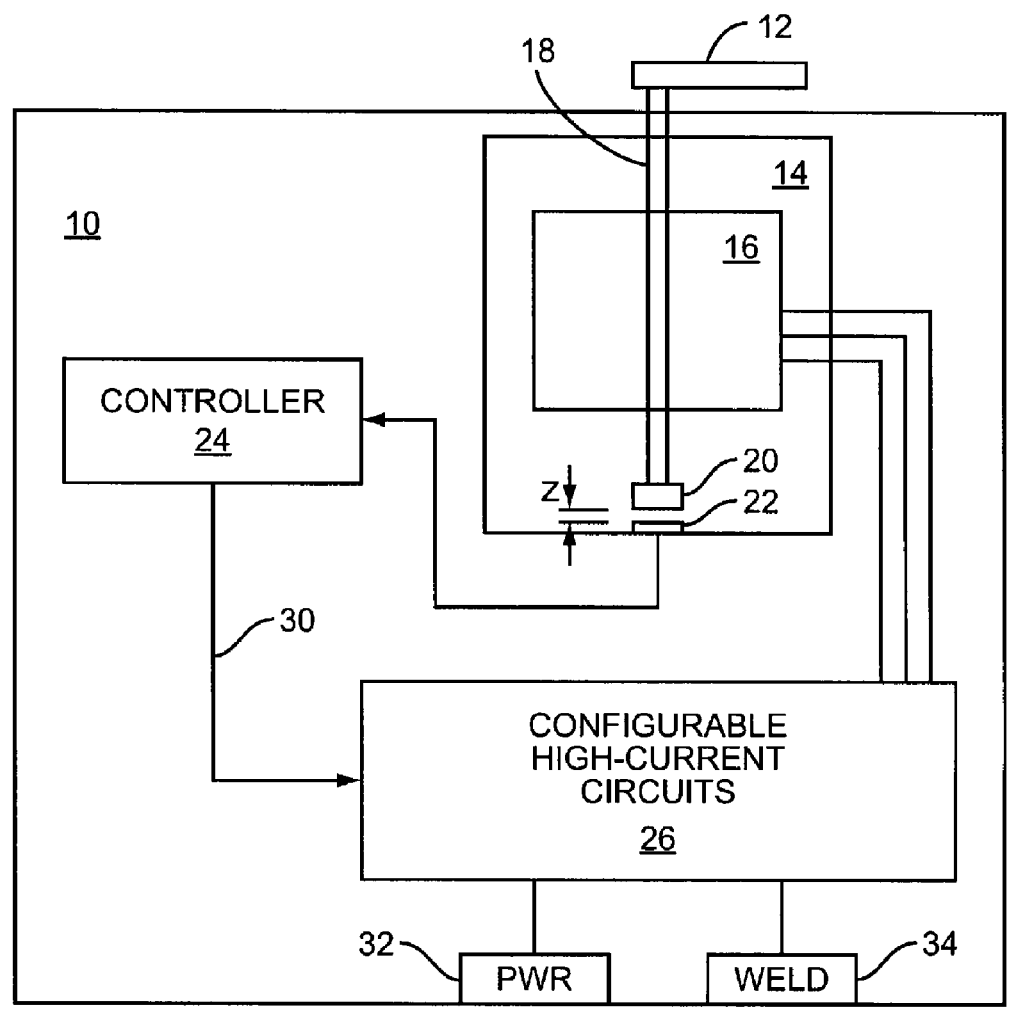
FIG. 1 is a functional block diagram of a unit of multi-function industrial equipment.

FIG. 1 depicts a functional block diagram of a representative unit of multi-function industrial equipment 10. The function of the equipment 10 is selected by a user turning the handle 12 of a rotary switch mechanism 14, which alters the path and/or direction of current flow through the switch contacts 16 and to a configurable high-current circuit 26, via conductors 28. As a non-limiting example, actuation of the switch mechanism 14 may change the function of the equipment 10 from a generator supplying power to a power output module 32, to a welder supplying welding current to a welding module 34.

The handle 12 is coupled to switch contacts 16 by a shaft 18, the center of which defines an axis of rotation. A two-pole magnet 20 is rigidly affixed to the shaft 18, such as by being glued thereon. A magnetic rotary encoder 22 is disposed proximate the magnet 20, and reports the radial position of the magnetic field generated by the magnet 20 (with respect to the axis of shaft 18 rotation) to a controller 24, which may comprise a processor, DSP, state machine, or the like. When the controller 24 detects the onset of actuation of the switch mechanism 14 by a slight change in the radial position of the magnetic field, it activates one or more signals 30 to remove current from one or more field coils of the configurable high-current circuit 26, preventing arcing at the switch contacts 16 during operative switch actuation.

Figure 2:
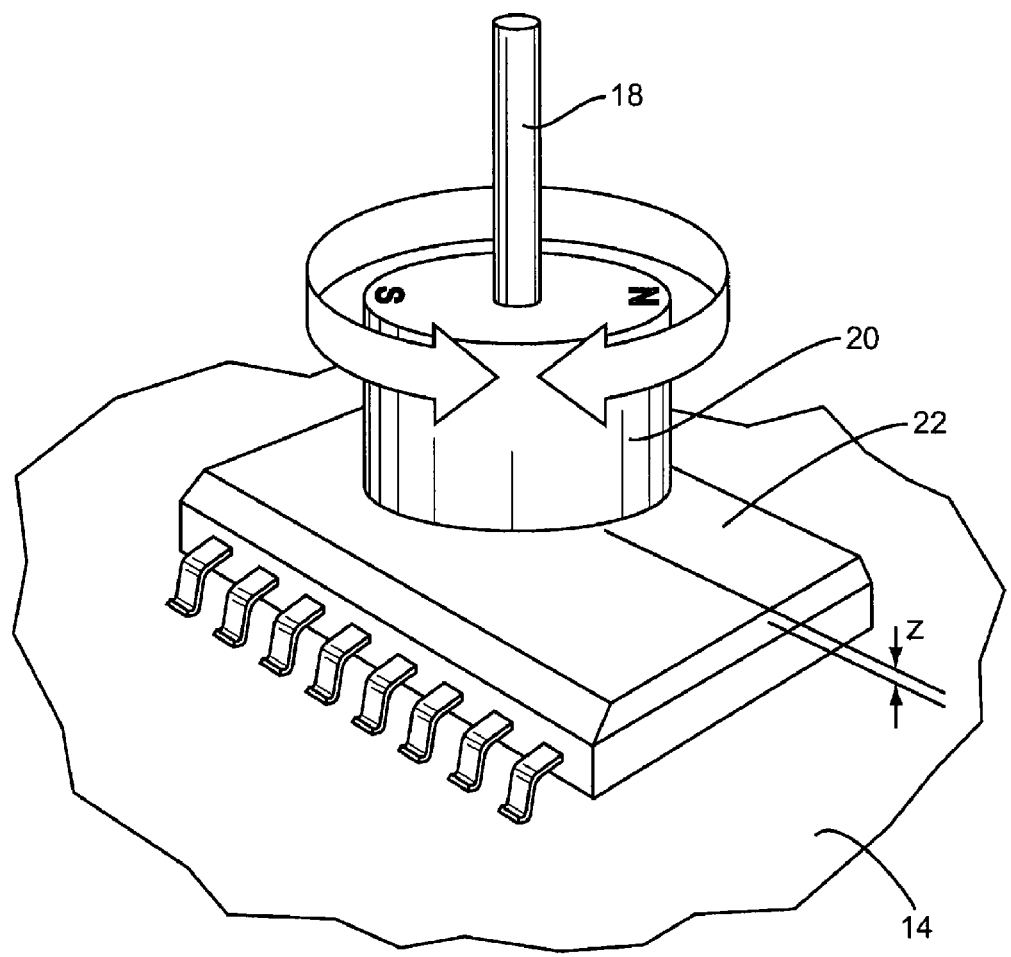
FIG. 2 is a perspective view of a magnet and magnetic rotary encoder.

In one embodiment, the magnet 20 is in the shape of a disk, 6 mm in diameter and at least 2.5 mm in height, as depicted in FIG. 2. The magnet may comprise materials such as rare earth AlNiCo/SmCo5 or NdFeB. The orientation of the magnetic poles of the magnet 20 with respect to the shaft 18 is not critical.

A magnetic rotary encoder 22, such as for example the AS5045, is affixed to the housing of the switch mechanism 14. The encoder 22 is spaced apart from the magnet 20 by a distance z, with the magnet 20 being centered over the operative zone of the encoder 22 integrated circuit die. In one embodiment, the gap or offset distance z is 0.5 mm to 1.5 mm. In any embodiment, the distance z places the magnet 20 within the operative range of the encoder 22, which in the case of the AS5045 results in a magnetic field strength at the encoder 22 die surface in the range of +/−45 mT to +/−75 mT. The distance z may be adjustable.

When the distance z is within the operative range of the encoder 22, the encoder 22 senses and indicates the radial position of the magnetic field—that is, the relative radial positions of the North and South poles of the magnet 20 with respect to the axis of the shaft 18. When the distance z is within the operative range, the magnetic field from the magnet 20 dominates the encoder 22, eliminating the effects of stray or environmental magnetic fields.

The magnetic rotary encoder 22 continuously samples the radial position of the magnetic field, such as up to 10.42 k samples per second for the AS5045. The magnetic field radial position is thus reported to the controller 24 as fast as each 96 μ-sec. By comparing successive indications of the magnetic field radial position, lost motion in the shaft 18 may be detected, indicating the onset of actuation of the switch mechanism 14. Considering the high position accuracy (0.0875°) and rapid data update rate (96 μ-sec.), false positive indications due to vibration or electrical noise may be eliminated by establishing a delta threshold, or minimum change, between successive magnetic field radial position reports required to generate an indication of the onset of switch actuation. Additionally or alternatively, actuation onset indication may require a threshold number of successive position reports (each optionally differing by a minimum threshold value) to avoid a false positive due to a momentary impact to the switch handle.

A "zero position," or absolute radial position at which the encoder 22 digital representation is zero, may be set as desired by clearing a register within the encoder 22 at a desired radial position. Since embodiments of the present invention detect rotary shaft motion by monitoring changes in the magnetic field radial position, the zero position is not critical, so long as the monitoring software can account for the rollover between zero and full scale deflection values. Accordingly, the orientation of the magnet 20 on the shaft 18 is not critical, and the ability to ignore this orientation greatly reduces the assembly cost of the switch mechanism 14.

Once the controller 24 detects the onset of actuation of the switch mechanism 14 by detecting rotary motion of the shaft 18, the controller 24 generates an indication of such and communicates it to the configurable high-current circuit 26 via one or more signals 30. The signal(s) 30 enable one or more protection circuits in the configurable high-current circuit 26 to remove high current from one or more circuits, such as field windings, prior to operative actuation of the switch mechanism 14. Such protection circuits are well known in the art, and are not explicated further herein. High currents are thus removed from the conductors 28 prior to the contacts of the switch mechanism 14 breaking electrical contact. In this manner, the contacts of the switch mechanism 14 are prevented from attempting to interrupt high current flow, which may cause dangerous and destructive arcing.

In one embodiment, the controller 24 directly reads successive radial positions of the magnetic field from the magnetic rotary encoder 22 as parallel or serial data. Additional data, such as an indication of the strength of the magnetic field, control bits, parity, and the like, may be included. In another embodiment, the magnetic rotary encoder 22 outputs a PWM pulse, the duty cycle of which is proportional to the magnetic field radial position. This output may be low-pass filtered to generate an analog voltage proportional to the magnetic field radial position. A change in this voltage level may be detected (either in active or passive analog circuits, or by an ADC and the controller 24 or other processor) to determine the onset of actuation of the switch mechanism 14. In general, magnetic rotary encoders 22 may communicate magnetic field radial positions in a variety of ways. Monitoring the magnetic field radial position to detect rotary movement of the shaft 18 may comprise receiving and interpreting any output of a magnetic rotary encoder 22 that indicates such position, and is encompassed within the broad scope of the present invention.

Figure 3:
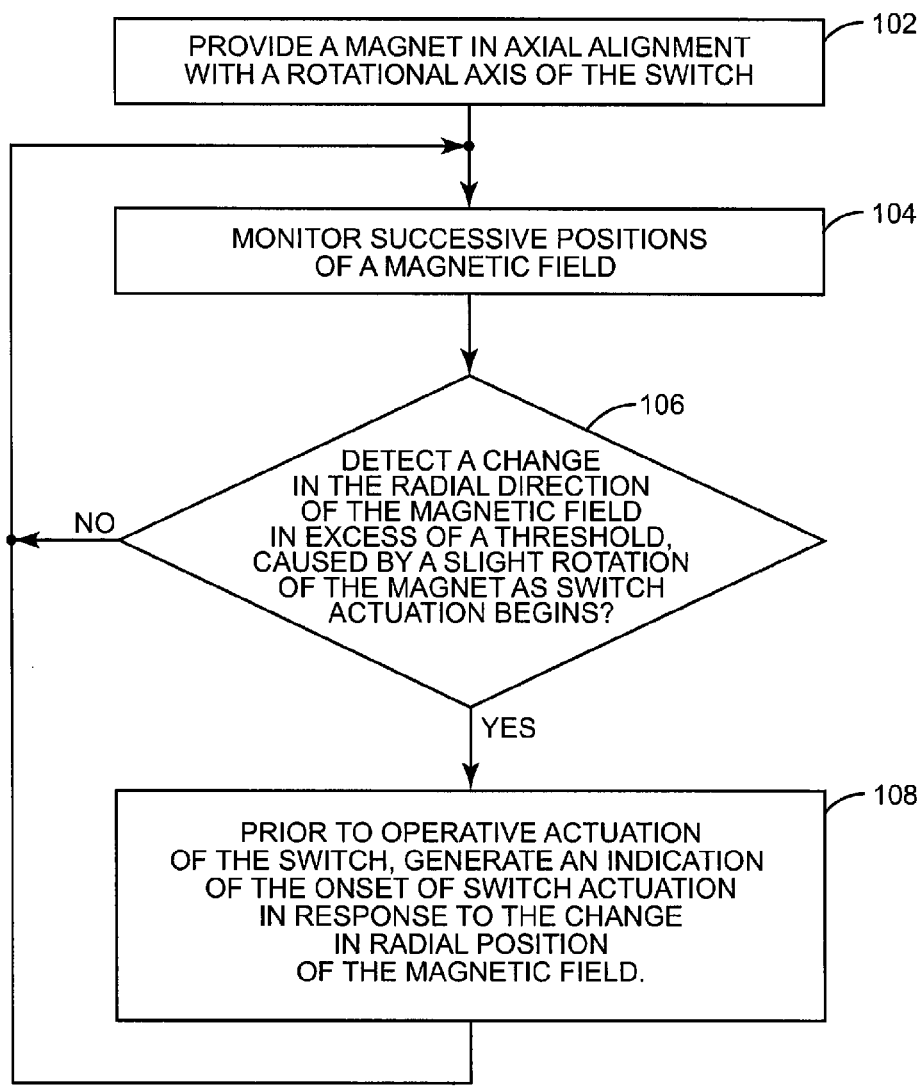
FIG. 3 is a flow diagram of a method of detecting the onset of actuation of a switch.

FIG. 3 depicts a method 100 of detecting the onset of actuation of a switch. A magnet 20 is provided, and affixed in axial alignment with a rotational axis of the switch (step 102). The position of the magnetic field is then monitored (step 104), such as reading successive position outputs of a magnetic rotary encoder 22 proximate to, and aligned with, the magnet 20. If a change in the radial direction of the magnetic field, optionally in excess of a predetermined threshold, is detected (block 106), then, prior to operative actuation of the switch, an indication of the onset of switch actuation is generated (block 108). If no change in radial direction of the magnetic field is detected (block 106), monitoring of the magnetic field position continues (block 104). Detection of a change in the radial direction of the magnetic field (block 106) may comprise comparing successive magnetic field radial positions, such as in a controller 24. The controller 24 may also generate the indication of the onset of switch actuation (block 108).

Detecting the onset of the actuation of a switch mechanism 14 by monitoring the radial position of a magnetic field presents numerous advantages over switch actuation prediction systems of the prior art. The magnet 20 is rigidly affixed to the switch rotary shaft 18, such as being glued thereon. This ensures no lost motion between the shaft 18 and the magnet 20. Prior art position encoders have mechanical components and couplings that inevitably introduce lost motion, reducing the sensitivity and accuracy of actuation onset detection.

The magnet 20 and magnetic rotary encoder 22 couple magnetically, not mechanically. Accordingly, the shaft 18 position encoding system contains no moving parts and no mechanical linkage or coupling. Hence, it is not subject to performance or accuracy degradation due to shock, thermal expansion, vibration, or wear. The critical dimensions—positioning the magnet 20 over the operative zone of the encoder 22 and the gap or offset distance z—are design parameters. Once manufactured, the switch mechanism 14 requires no calibration or adjustment (although, in some embodiments, either or both dimensions may be made adjustable, if desired or required). The sensitivity of the system and its immunity to false positive alerts can be adjusted in software, such as by adjusting a delta position threshold and/or a number of successive changed observations threshold. Actuation onset detection—even with high threshold values—can easily be accomplished in a millisecond, providing an ample window for operation of the protection circuits prior to operative switch actuation.

While the present invention has been described herein with respect to a rotary switch mechanism 14, the scope and applicability of the present invention is not so limited. For example, a magnet may be affixed to the pivot point of a conventional linear switch (e.g., light switch), rocker switch, or any other switch mechanism in which actuation of a switch entails pivotal or rotary motion. Furthermore, a switch mechanism without pivotal or rotary motion, such as a pushbutton switch, may be mechanically altered to add a member that pivots or rotates upon the switch actuation, providing a mounting point for a magnet 20, and application of the present invention for actuation onset detection.

While the present invention has been described herein with respect to multi-function industrial equipment 10 having configurable high-current circuits 26, the present invention is not so limited. Those of skill in the art will readily recognize that detection of the lost motion of a rotating or pivoting axis in a switch, prior to operative actuation of the switch, by detecting a change in the radial position of a magnetic field, has wide applicability. For an example, the present invention may be advantageously employed in any situation in which actuation of a switch may have adverse consequences, or in any situation in which advance warning of the onset of switch actuation is required or desired.

As used herein, the term "actuation" of a switch means a change in the electrical state of a switch, e.g., from "off" to "on" or vice versa, or a change in one or more electrical contact connections in a multi-contact switch. "Operative actuation" of a switch means the actual electrical breaking or making of one or more electrical contacts. "Onset of actuation" of a switch means force has been applied to a switch handle, lever, or the like, and some mechanical motion has occurred; however, the switch has not yet achieved operative actuation and no electrical contact has yet broken or made connection.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of detecting the onset of actuation of a switch comprising:
   providing a magnet in axial alignment with a rotational axis of the switch;
   sensing a change in the radial position of a magnetic field caused by a slight rotation of the magnet as switch actuation begins; and
   generating, prior to operative actuation of the switch, an indication of the onset of switch actuation in response to the change in radial position of the magnetic field.

2. The method of claim 1 wherein sensing a change in the radial position of the magnetic field comprises positioning a magnetic rotary encoder operatively adjacent the magnet and monitoring one or more outputs of the magnetic rotary encoder.

3. The method of claim 2 wherein monitoring one or more outputs of the magnetic rotary encoder comprises reading a digital output of the magnetic rotary encoder, the digital output encoding the magnetic field radial position.

4. The method of claim 2 wherein monitoring one or more outputs of the magnetic rotary encoder comprises sensing a pulse width modulated (PWM) output of the magnetic rotary encoder, the duty cycle of the PMW output being proportional to the magnetic field radial position.

5. The method of claim 4 wherein sensing the PWM output of the magnetic rotary encoder comprises low pass filtering the PWM output and sensing a resulting analog voltage, the analog voltage proportional to the magnetic field radial position.

6. The method of claim 2 wherein sensing a change in the radial position of the magnetic field comprises sensing a change in one or more monitored outputs of the magnetic rotary encoder greater than a predetermined threshold.

7. The method of claim 1 further comprising altering a present circuit configuration in response to the indication of the onset of switch actuation, before the switch completes actuation, to avoid an undesired electrical condition if the switch actuates with the present circuit configuration maintained.

8. The method of claim 1 wherein the magnet is rigidly affixed to the switch rotational axis, such that any change in the radial position of the magnetic field is due to the onset of switch actuation.

9. A switch mechanism, comprising:
   a member that pivots or rotates as the switch is actuated;
   a magnet affixed to the pivoting or rotating member on the axis of rotation; and
   a magnetic rotary encoder disposed proximate the magnet and operative to sense and indicate the radial position of a magnet field generated by the magnet.

10. The switch mechanism of claim 9 further comprising a controller communicatively coupled to the encoder and operative to detect the onset of actuation of the switch mechanism by detecting a change in the radial position of the magnet field prior to operative actuation of the switch.

11. A unit of multi-function industrial equipment, comprising:
   a configurable high-current circuit operative to perform at least two distinct functions depending on the configuration and direction of current flow;
   a high-current switch mechanism electrically connected to the configurable high-current circuit, the switch operative to select a function of the configurable high-current circuit by changing between predetermined configurations of electrical contacts, the switch actuated by rotating or pivoting a member having a magnet affixed thereto on the axis of rotation; and
   a controller operative to monitor a radial position of a magnetic field of the magnet, and further operative to detect the onset of actuation of the switch mechanism by detecting a change in the radial position of the magnet field prior to operative actuation of the switch mechanism.

12. The multi-function equipment of claim 11 further comprising a magnetic rotary encoder disposed proximate the magnet, the encoder operative to sense and indicate to the controller the radial position of a magnetic field of the magnet about the axis of rotation.

13. The multi-function equipment of claim 11 wherein the indication of the radial position of the magnetic field is a digital value.

14. The multi-function equipment of claim 11 wherein the indication of the radial position of the magnetic field is a Pulse Width Modulated signal.

15. The multi-function equipment of claim 11 further comprising one or more protective circuits operative to remove current from one or more circuits in the configurable high-current circuit in response to the detection of the onset of actuation of the switch mechanism and prior to operative actuation of the switch mechanism.

16. The multi-function equipment of claim 15 wherein removal of the current from one or more circuits precludes arcing at one or more switch mechanism contacts upon operative actuation of the switch mechanism.

17. The multi-function equipment of claim 11 wherein the at least two distinct functions include a generator function and a welder function.

\* \* \* \* \*